United States Patent [19]

Naeher et al.

[11] Patent Number: 5,698,112
[45] Date of Patent: Dec. 16, 1997

[54] CORROSION PROTECTION FOR MICROMECHANICAL METAL LAYERS

[75] Inventors: Ulrich Naeher; Emmerich Bertagnolli, both of Munich, Germany

[73] Assignee: Siemens Aktiengesellschaft, Munich, Germany

[21] Appl. No.: 548,517

[22] Filed: Oct. 26, 1995

[30] Foreign Application Priority Data

Nov. 24, 1994 [DE] Germany ............. 44 41 900.7

[51] Int. Cl.⁶ ................................ C23F 1/00
[52] U.S. Cl. .............. 216/2; 216/11; 216/46; 216/100; 156/644.1
[58] Field of Search ............. 156/644.1, 656.1, 156/661.11; 216/2, 11, 46, 51, 56, 99, 100, 102, 103, 109; 437/278

[56] References Cited

U.S. PATENT DOCUMENTS

| | | | |
|---|---|---|---|
| 5,129,983 | 7/1992 | Greiff | 156/628 |
| 5,258,097 | 11/1993 | Mastrangelo | 216/39 |
| 5,262,000 | 11/1993 | Welbourn et al. | 156/643.1 |
| 5,353,638 | 10/1994 | Marek | 216/2 |
| 5,393,375 | 2/1995 | MacDonald et al. | 156/643.1 |
| 5,441,597 | 8/1995 | Bonne et al. | 216/2 |
| 5,493,177 | 2/1996 | Muller et al. | 313/578 |
| 5,531,018 | 7/1996 | Saia et al. | 216/105 |
| 5,587,343 | 12/1996 | Kano et al. | 216/2 |
| 5,650,356 | 7/1997 | Grivna et al. | 156/656.1 |

FOREIGN PATENT DOCUMENTS 40 00 496 A1  2/1991  Germany.
404056274A  2/1992  Japan.

OTHER PUBLICATIONS

"Scream I: A Single Mask, Single–Crystal Silicon Process For Microelectromechanical Structures" by Keven A. Shaw et al, 1993 IEEE, pp. 155–159 Proceedings—Micro Electro Mech. Sys. Feb. 1993.

Primary Examiner—Nam Nguyen
Assistant Examiner—Anita Alanko
Attorney, Agent, or Firm—Hill, Steadman & Simpson

[57] ABSTRACT

A metal layer provided for micromechanical components such as sensors or actuators is surrounded with a protective layer of, for example, TiN for protection against the influence of an etchant that is employed for etching out a cavity in a sacrificial layer of, for example, silicon dioxide. The lower part and the upper part of this protective layer are produced as layers. A supplementary protective layer is conformally deposited into the etching holes produced for etching the cavity out and is anisotropically re-etched, so that the metal layer is also laterally covered by the protective layer.

7 Claims, 1 Drawing Sheet

CORROSION PROTECTION FOR MICROMECHANICAL METAL LAYERS

BACKGROUND OF THE INVENTION

Monolithic integration of components with micromechanical surface structures together with electronic components for drive and measuring circuits on a chip and the manufacture within the framework of the same process yield substantial advantages with reference to performance, dependability, miniaturization and costs of these component parts.

Micromechanical sensor and actuator structures are produced by etching membranes, oscillators or resonators and the like. Cavities are etched under layers provided for them. Particularly, these etching processes raise completely new demands which are made of the selectivity of the etchants, compared to traditional methods.

When etching cavities under a metal layer (particularly, for example, given aluminum or an aluminum alloy)—a method step that often occurs in the manufacture of self-bearing membranes—a sacrificial layer located under a thin metal layer must be removed, at least in sections. Silicon dioxide, for example borophosphorus silicate glass, or some other silicon compound, is generally employed as the sacrificial layer. The problem arises that an etching process that selectively etches silicon dioxide simultaneously attacks the metal of the metal layer provided for the membrane. There is no etching process for many metals, particularly aluminum alloys, that anisotropically etches silicon dioxide, but does not attack the metal. In many instances, etching the metal layers free by etching cavities in sacrificial layers composed of silicon oxide is thereby not possible without simultaneous corrosion of the metal.

SUMMARY OF THE INVENTION

An object of the present invention is to specify a possibility of how micromechanical structures of metal can be etched free in a corrosion-free manner.

According to the method of the invention for manufacturing a micromechanical component having a metal layer provided for a sensor or actuator, a sacrificial layer is provided. A lower protective layer is applied onto the sacrificial layer, the lower protective layer being of a material that is resistant to a chemical substance provided for removal of the sacrificial layer. The metal layer is applied onto the lower protective layer. An upper protective layer of the material that is resistant to the chemical substance provided for the removal of the sacrificial layer is applied onto the metal layer. At least one etching hole is anisotropically etched through the upper protective layer, through the metal layer, and through the lower protective layer. A supplementary protective layer composed of a material that is resistant to the chemical substance provided for removing the sacrificial layer is conformally deposited so that the metal layer is completely covered. The supplementary protective layer is re-etched anisotropically to such an extent that the sacrificial layer is uncovered in the etching hole and the metal layer remains completely covered. The sacrificial layer is then etched out through the etching hole.

DESCRIPTION OF THE PREFERRED EMBODIMENTS

In the solution according to the invention, the micromechanical structure of metal is surrounded with a protective layer that is resistant to the chemical substance that is employed for etching a sacrificial layer. This component and the corresponding manufacturing method are set forth in detail with reference to FIGS. 1–4 that show intermediate stages of an inventive component after various steps of the manufacturing method. For the sake of clarity, the lateral wall of an etching hole 8 or of an etched cavity 9 in the viewing direction has been omitted for the sake of clarity.

Figure 4:
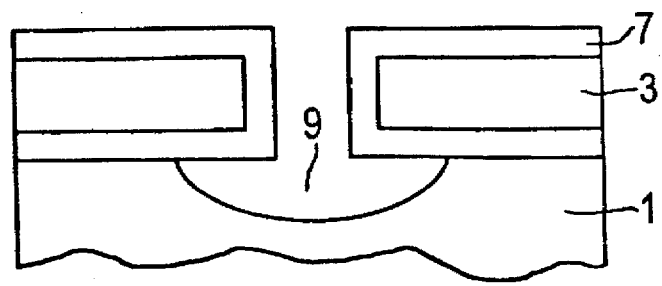

In the inventive component corresponding to FIG. 4, a metal layer 3 is applied over a sacrificial layer 1. A cavity 9 is etched in the sacrificial layer 1 through an etched hole in order to uncover a part of the metal layer 3 as a membrane or the like. This part of the metal layer 3 is then arranged at a spacing from the remaining part of the component. In order to protect the metal against the etching attack when etching out the sacrificial layer, a protective layer 7 that is resistant to the etchant is applied all around the metal layer 3 on the upper sides thereof. In this way, the micromechanical structures that have at least their upper sides to be uncovered and provided with this protective layer 7 can be etched in a corrosion-free manner.

Figure 1:
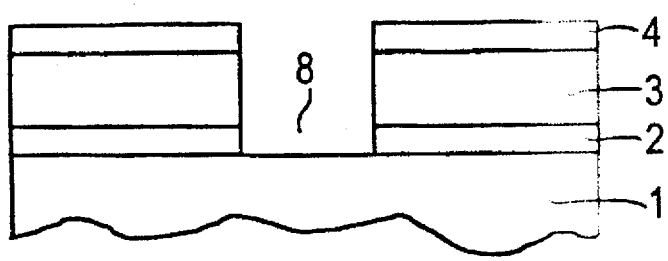
FIGS. 1 through 4 illustrate in a side cross-sectional view method steps of the invention for manufacturing a micromechanical component having a metal layer provided for a sensor or actuator according to the invention.

This component, for example, is manufactured in that a lower protective layer 2 is applied at least in the region provided for the metal layer on a sacrificial layer 1 that, for example, can be silicon oxide, silicon dioxide, or some other silicon compound. The metal layer 3 and an upper protective layer 4 are applied on this lower protective layer 2, so that the layer sequence shown in FIG. 1 is present. The material of the lower protective layer 2 and of the upper protective layer 4 is thus selected such that the etchant provided for etching the sacrificial layer 1 out does not attack these protective layers, or attacks them only to an insignificant extent. The thickness of the protective layers is dimensioned such that the metal layer 3 is sure to remain covered by the protective layers during the etching process.

Figure 2:
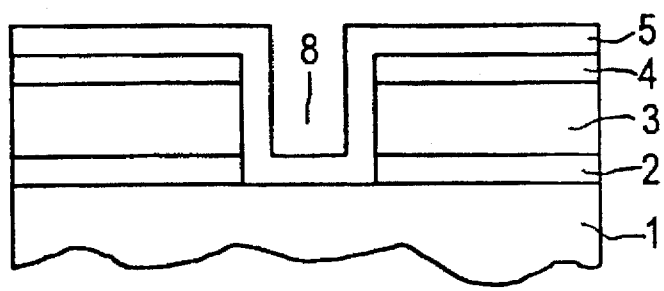
Figure 3:
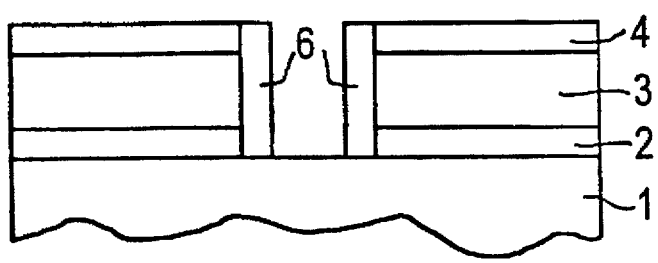

In order to be able to etch a cavity into the sacrificial layer 1 under the metal layer 3, at least one, and preferably a plurality, of etching holes 8 are etched into this layer sequence composed of the metal layer and of the two protective layers. An etching hole 8 has a diameter of, for example, approximately 1 μm. The metal layer 3 is uncovered at the walls of the etching hole 8 and can be attacked by an etchant thereat. A supplementary protective layer 5, as shown in FIG. 2, is deposited in conforming manner in order to prevent this, so that it covers the surface of the upper protective layer 4 and the walls and the floor of the etching hole 8 as a layer. The material of this supplementary protective layer 5 is likewise selected such that it is not attacked or is only insignificantly attacked by the chemical substance provided for the etching of the cavity in the sacrificial layer 1. The floor of the etching hole must then in turn be freed of this supplementary protective layer 5 in order to again uncover the surface of the sacrificial layer 1 here. This, for example, can occur in that the supplementary protective layer is re-etched anisotropically, whereby a remaining portion 6 (see FIG. 3) of this supplementary protective layer 5 remains at the lateral walls of the etching hole 8. This remaining portion 6 of the supplementary protective layer, together with the lower protective layer 2 and the upper protective layer 4, forms the protective layer 7 that is shown in FIG. 4 and surrounds the surface of the metal layer 3. The metal layer 3 is protected against the etchant in this way, this being applied then in order to etch the cavity 9 out in the sacrificial layer 1. This cavity 9 is etched to have a size such that the portion of the metal layer 3 that is intended to form the membrane or the oscillatory or resonant element is separated from the remaining part of the component by an adequately large spacing.

Exemplary embodiments of the component of the invention and method that can be manufactured within the framework of standard processes for manufacturing integrated micromechanical components in silicon are especially advantageous. In particular, for example, an aluminum layer or a layer composed of an aluminum alloy is employed as metal layer. This metal layer provided for the micromechanical structure is usually enclosed between thin layers of TiN. These layers, for example, are 50 nm thick. The lower layer thereby serves as a diffusion barrier for the metal introduced into via holes. The upper layer serves as an anti-reflection layer for a following phototechnique. These layers can be employed as a lower protective layer and as an upper protective layer in the component of the invention. The upper layer of TiN should thus be designed, for example, approximately 30 nm thicker than would be required for an anti-reflection layer. The TiN is resistant to hydrofluoric acid (HF). Silicon dioxide can be etched with HF (for example, in a ratio of 5:1, buffered with ammonia fluoride), this silicon dioxide, for example, being employed as a material for the sacrificial layer 1.

After the deposition of the upper protective layer 4, etching holes 8 are anisotropically etched in the layer sequence. Given the recited materials, for example, this can occur with RIE (reactive ion etching) upon employment of $BCl_3$ or $Cl_2$. As a supplementary process step, the supplementary protective layer 5 is then conformally deposited as a layer of, for example, TiN which, for example, is approximately 50 nm thick, whereby a CVD process (chemical vapor deposition) that is employed assures a pore-free deposition. A relatively lower deposition temperature must be selected because of the aluminum present therein. The insides of the etching holes are completely covered with the material of the supplementary protective layer, (TiN in this example) with this method step. No metal of the metal layer 3 can then be exposed toward the outside to the attack of the etchant. The floor of the etching holes 8, i.e. the access for the following, wet-chemical etching of the silicon dioxide that is the material of the sacrificial layer 1 in this example, however, is blocked by this supplementary protective layer 5. For this reason, the supplementary protective layer on the floor of the etching holes must be removed. This occurs best since this supplementary protective layer is anisotropically re-etched, whereby no mask technique is required. The lateral walls of the etching holes remain covered by the protective layer in this way and the sacrificial layer is uncovered at the floor of the etching holes. The silicon dioxide can then be removed, for example, with a liquid etchant such as, for example, hydrofluoric acid, whereby the metal layer 3 is protected against the etching attack by the protective layer 7 on all sides.

The inventive manufacturing process set forth herein thus represents a simple method of etching micromechanical structures out of metal without the metal being thereby attacked. The inventive structure of the component and of this method can be inserted in a simple way into the process execution of manufacturing integrated micromechanical sensors or actuators.

Although various minor changes and modifications might be proposed by those skilled in the art, it will be understood that our wish is to include within the claims of the patent warranted hereon all such changes and modifications as reasonably come within our contribution to the art.

We claim as our invention:

1. A method for manufacturing a micromechanical component having a metal layer provided for a sensor or actuator, comprising the steps of:

providing a sacrificial layer;

applying onto the sacrificial layer a lower protective layer of a material that is resistant to a chemical substance provided for removal of the sacrificial layer;

applying the metal layer onto the lower protective layer;

applying an upper protective layer of a material that is resistant to the chemical substance provided for the removal of the sacrificial layer onto said metal layer;

anisotropically etching at least one etching hole through said upper protective layer, through said metal layer, and through said lower protective layer, the metal layer being laterally uncovered by the etching out of the etching hole;

conformally depositing a supplementary protective layer composed of a material that is resistant to the chemical substance provided for removing the sacrificial layer so that the metal layer is completely covered and walls of the etching hole are covered;

re-etching said supplementary protective layer anisotropically to such an extent that the sacrificial layer is uncovered in the etching hole and the metal layer remains completely covered; and etching out the sacrificial layer through the etching hole.

2. A method according to claim 1 including the step of applying a layer of aluminum as said metal layer.

3. A method according to claim 1 including the step of applying a layer of an aluminum alloy as said metal layer.

4. A method according to claim 1 including the step of providing the sacrificial layer as silicon, and providing the lower protective layer and the upper protective layer as TiN.

5. A method according to claim 1 including the step of providing the lower protective layer, the upper protective layer, and the supplementary protective layer of a same material.

6. A method according to claim 1 including the step of employing the sacrificial layer as silicon oxide, and employing a liquid etchant that contains HF for the etching out of the sacrificial layer.

7. A method for manufacturing a micromechanical component having a metal layer provided for a sensor or actuator, comprising the steps of:

providing a sacrificial layer;

applying onto the sacrificial layer a lower protective layer of a material chosen to be resistant to a chemical substance provided for etching of the sacrificial layer in a later step of the manufacturing method;

applying the metal layer onto the lower protective layer;

applying onto said metal layer an upper protective layer of a material selected so that it is resistant to said chemical substance provided for etching of said sacrificial layer;

etching at least one etching hole through said upper protective layer, through said metal layer, and through said lower protective layer;

depositing onto said metal layer, onto side walls of said etching hole, and onto a portion of said sacrificial layer exposed in said etching hole a supplementary protective layer composed of a material selected such that it is resistant to said chemical substance provided for etching said sacrificial layer;

etching said supplementary protective layer so as to remove only portions of said supplementary protective layer lying on said sacrificial layer between portions of said supplementary protective layer on said side walls of said etching hole; and etching out the sacrificial layer through the etching hole such that portions of said sacrificial layer beneath said etching hole and also underlying portions of said metal layer adjacent said etching hole are removed.

* * * * *